US012586751B2

(12) United States Patent
Kobayashi et al.

(10) Patent No.: US 12,586,751 B2
(45) Date of Patent: Mar. 24, 2026

(54) TRANSFER DEVICE AND ANALYSIS SYSTEM

(71) Applicant: Hitachi High-Tech Corporation, Tokyo (JP)

(72) Inventors: Naofumi Kobayashi, Tokyo (JP); Kenichi Nishinaka, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 542 days.

(21) Appl. No.: 17/917,973

(22) PCT Filed: Apr. 15, 2020

(86) PCT No.: PCT/JP2020/016525
§ 371 (c)(1),
(2) Date: Oct. 10, 2022

(87) PCT Pub. No.: WO2021/210087
PCT Pub. Date: Oct. 21, 2021

(65) Prior Publication Data
US 2023/0126577 A1 Apr. 27, 2023

(51) Int. Cl.
*H01J 37/20* (2006.01)
*H01J 37/22* (2006.01)
*H01J 37/244* (2006.01)

(52) U.S. Cl.
CPC ............ *H01J 37/20* (2013.01); *H01J 37/222* (2013.01); *H01J 37/244* (2013.01)

(58) Field of Classification Search
CPC ........ H01J 37/20; H01J 37/222; H01J 37/244; H01J 2237/2007; H01J 2237/20292; H01J 2237/208; H01J 37/28
See application file for complete search history.

(56) References Cited

U.S. PATENT DOCUMENTS 4,596,934 A * 6/1986 Yanaka ................... H01J 37/20
250/442.11
5,783,830 A * 7/1998 Hirose ..................... G01N 1/32
250/442.11

(Continued)

FOREIGN PATENT DOCUMENTS

JP 61-101945 A 5/1986
JP 10-64473 A 3/1998

(Continued)

OTHER PUBLICATIONS

International Search Report (PCT/ISA/210) issued in PCT Application No. PCT/JP2020/016525 dated Jun. 16, 2020 with English translation (five (5) pages).

(Continued)

*Primary Examiner* — David A Vanore
(74) *Attorney, Agent, or Firm* — Crowell & Moring LLP

(57) ABSTRACT

Provided is a technique capable of shortening observation throughput of a sample. A transfer device 2 includes a holder 24 configured to hold a mesh MS on which a sample to be analyzed using a charged particle beam device 3 is mounted, a position information acquisition function configured to acquire first information about a positional relationship between the mesh MS and the holder 24, and a position information output function configured to output the first information to the charged particle beam device 3.

15 Claims, 13 Drawing Sheets

(56) References Cited

U.S. PATENT DOCUMENTS

| | | | | |
|---|---|---|---|---|
| 8,334,519 | B2 * | 12/2012 | Ono | G01R 31/307 |
| | | | | 250/306 |
| 2008/0018460 | A1 * | 1/2008 | Ishiguro | H01J 37/3005 |
| | | | | 250/492.21 |
| 2012/0112064 | A1 * | 5/2012 | Nagakubo | G01N 1/286 |
| | | | | 250/442.11 |
| 2015/0166273 | A1 * | 6/2015 | Price | G01N 35/00732 |
| | | | | 414/222.01 |
| 2015/0221470 | A1 * | 8/2015 | Ominami | H01J 37/16 |
| | | | | 250/441.11 |
| 2017/0271122 | A1 * | 9/2017 | Oonishi | H01J 37/20 |
| 2017/0278667 | A1 * | 9/2017 | Iwahori | H01J 37/20 |
| 2019/0131104 | A1 * | 5/2019 | Shirasaki | H01J 37/28 |
| 2020/0219697 | A1 * | 7/2020 | Hirano | H01J 37/09 |
| 2021/0012997 | A1 * | 1/2021 | Hayashi | H01J 37/14 |
| 2021/0249221 | A1 * | 8/2021 | Okai | H01J 37/12 |
| 2021/0272770 | A1 * | 9/2021 | Sohda | H01J 37/153 |
| 2023/0126577 | A1 * | 4/2023 | Kobayashi | H01J 37/20 |
| | | | | 250/442.11 |

FOREIGN PATENT DOCUMENTS

| | | | |
|---|---|---|---|
| JP | 2008-27669 | A | 2/2008 |
| JP | 2010-257617 | A | 11/2010 |
| JP | 2011-80869 | A | 4/2011 |
| JP | 2011-129443 | A | 6/2011 |
| JP | 2013-33066 | A | 2/2013 |
| JP | 2014-56785 | A | 3/2014 |
| JP | 2017-500722 | A | 1/2017 |
| WO | WO 2008/049134 | A2 | 4/2008 |

OTHER PUBLICATIONS

Japanese-language Written Opinion (PCT/ISA/237) issued in PCT Application No. PCT/JP2020/016525 dated Jun. 16, 2020 (four (4) pages).
Japanese-language International Preliminary Report on Patentability (PCT/IPEA/402 & PCT/IPEA/409) issued in PCT Application No. PCT/JP2020/016525 dated Aug. 25, 2020 (five (5) pages).

* cited by examiner

[FIG. 1]
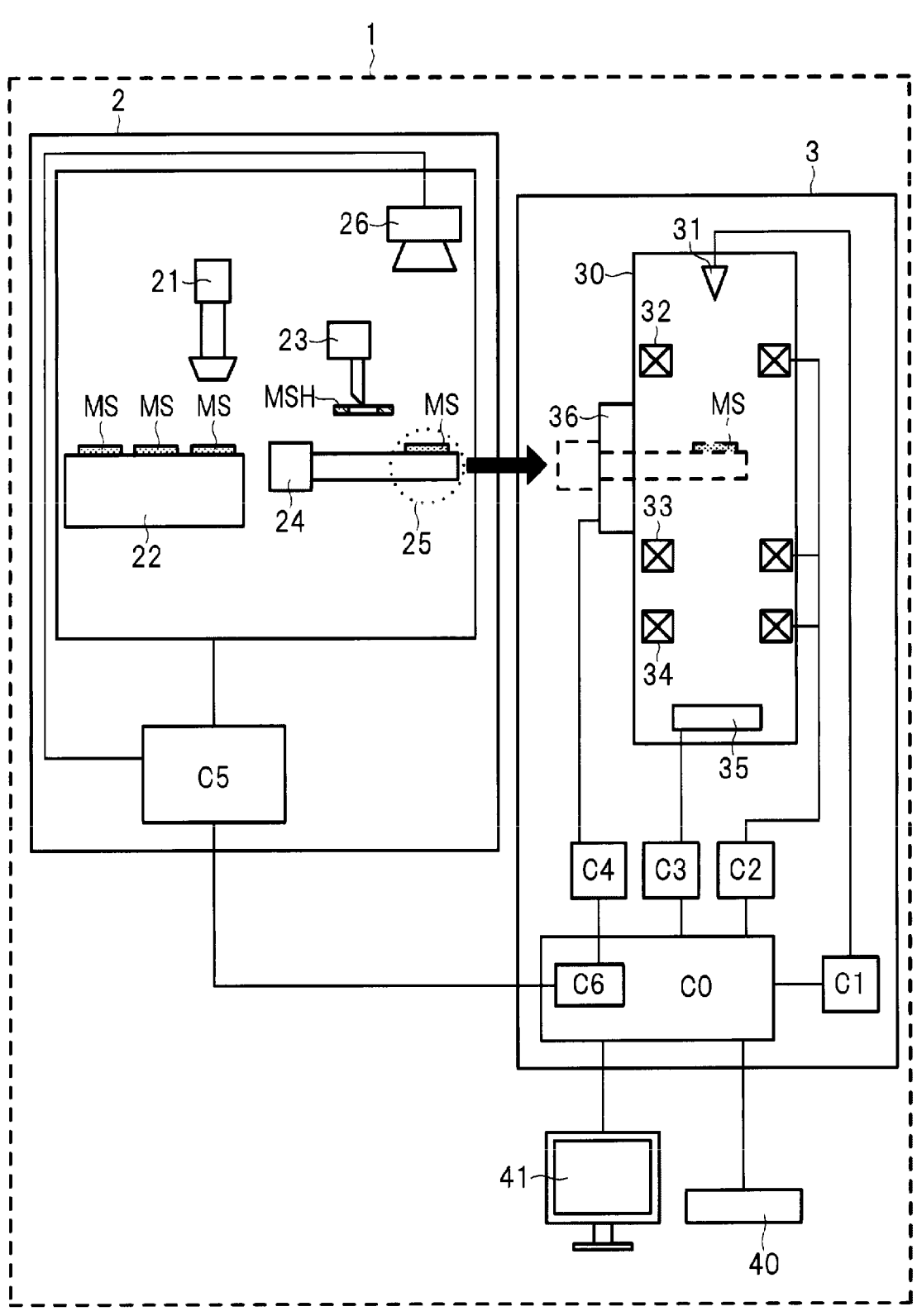

[FIG. 2]

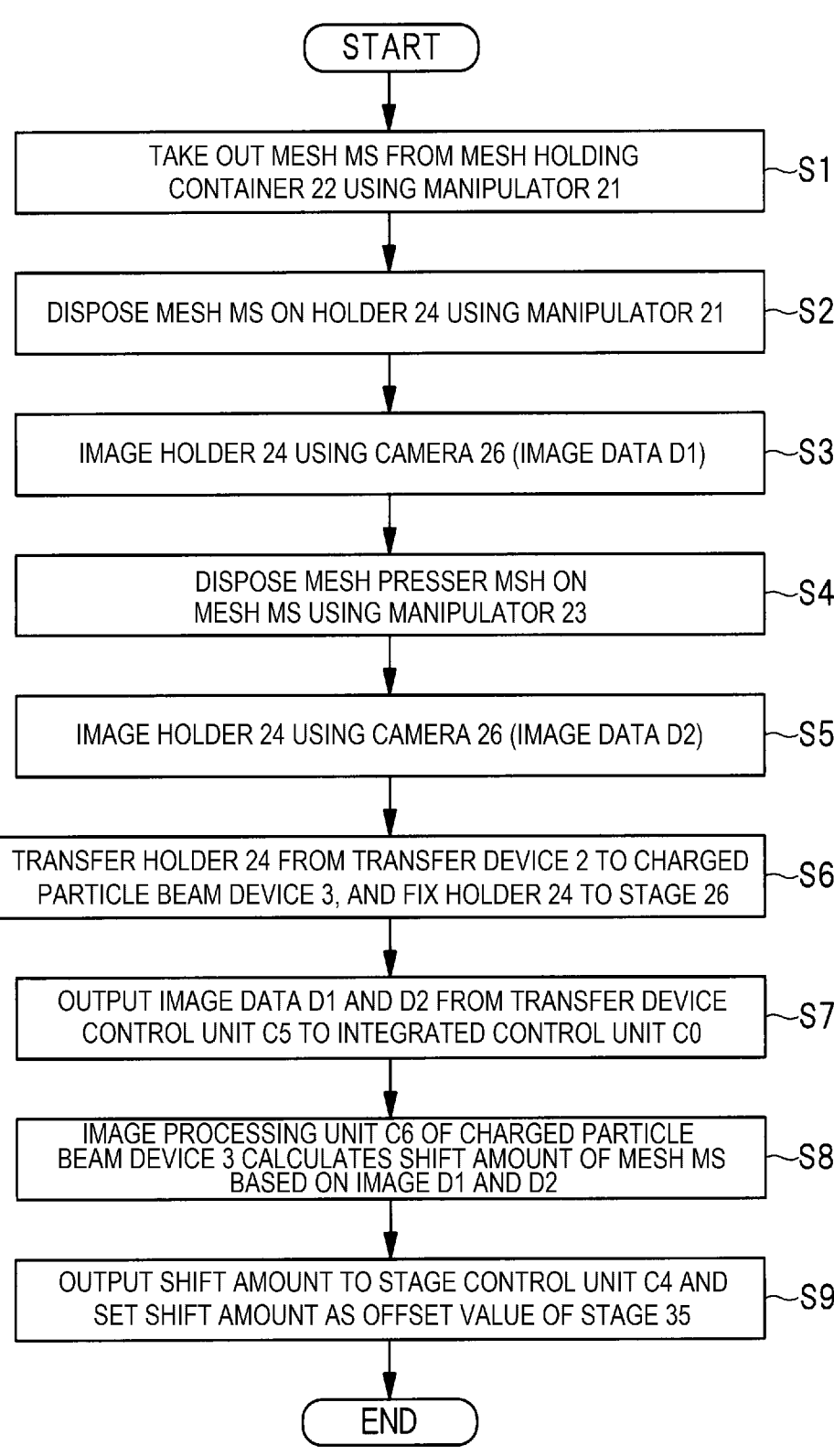

START

TAKE OUT MESH MS FROM MESH HOLDING
CONTAINER 22 USING MANIPULATOR 21 —— S1

DISPOSE MESH MS ON HOLDER 24 USING MANIPULATOR 21 —— S2

IMAGE HOLDER 24 USING CAMERA 26 (IMAGE DATA D1) —— S3

DISPOSE MESH PRESSER MSH ON
MESH MS USING MANIPULATOR 23 —— S4

IMAGE HOLDER 24 USING CAMERA 26 (IMAGE DATA D2) —— S5

TRANSFER HOLDER 24 FROM TRANSFER DEVICE 2 TO CHARGED
PARTICLE BEAM DEVICE 3, AND FIX HOLDER 24 TO STAGE 26 —— S6

OUTPUT IMAGE DATA D1 AND D2 FROM TRANSFER DEVICE
CONTROL UNIT C5 TO INTEGRATED CONTROL UNIT C0 —— S7

IMAGE PROCESSING UNIT C6 OF CHARGED PARTICLE
BEAM DEVICE 3 CALCULATES SHIFT AMOUNT OF MESH MS
BASED ON IMAGE D1 AND D2 —— S8

OUTPUT SHIFT AMOUNT TO STAGE CONTROL UNIT C4 AND
SET SHIFT AMOUNT AS OFFSET VALUE OF STAGE 35 —— S9

END

[FIG. 3]
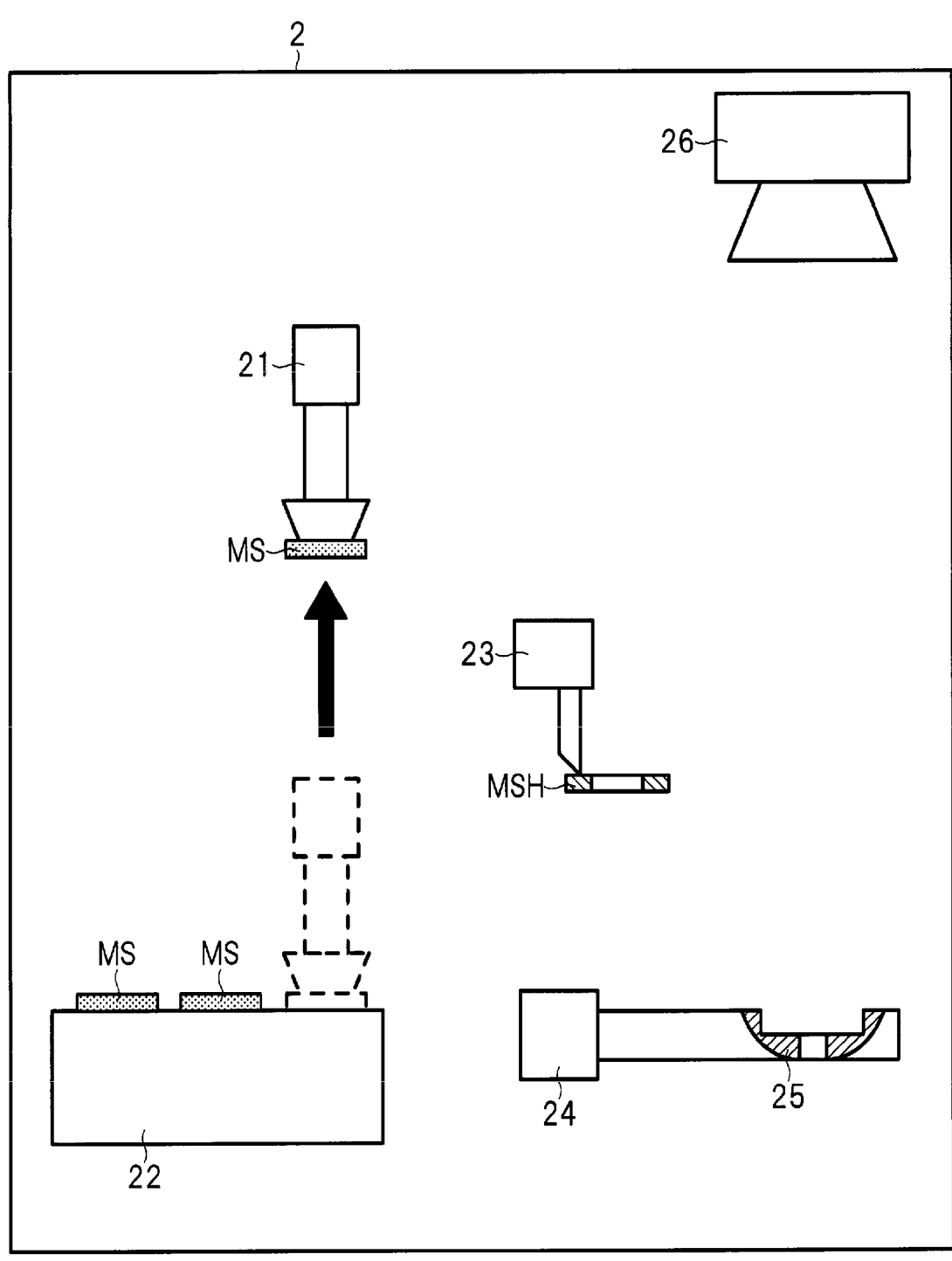

[FIG. 4]
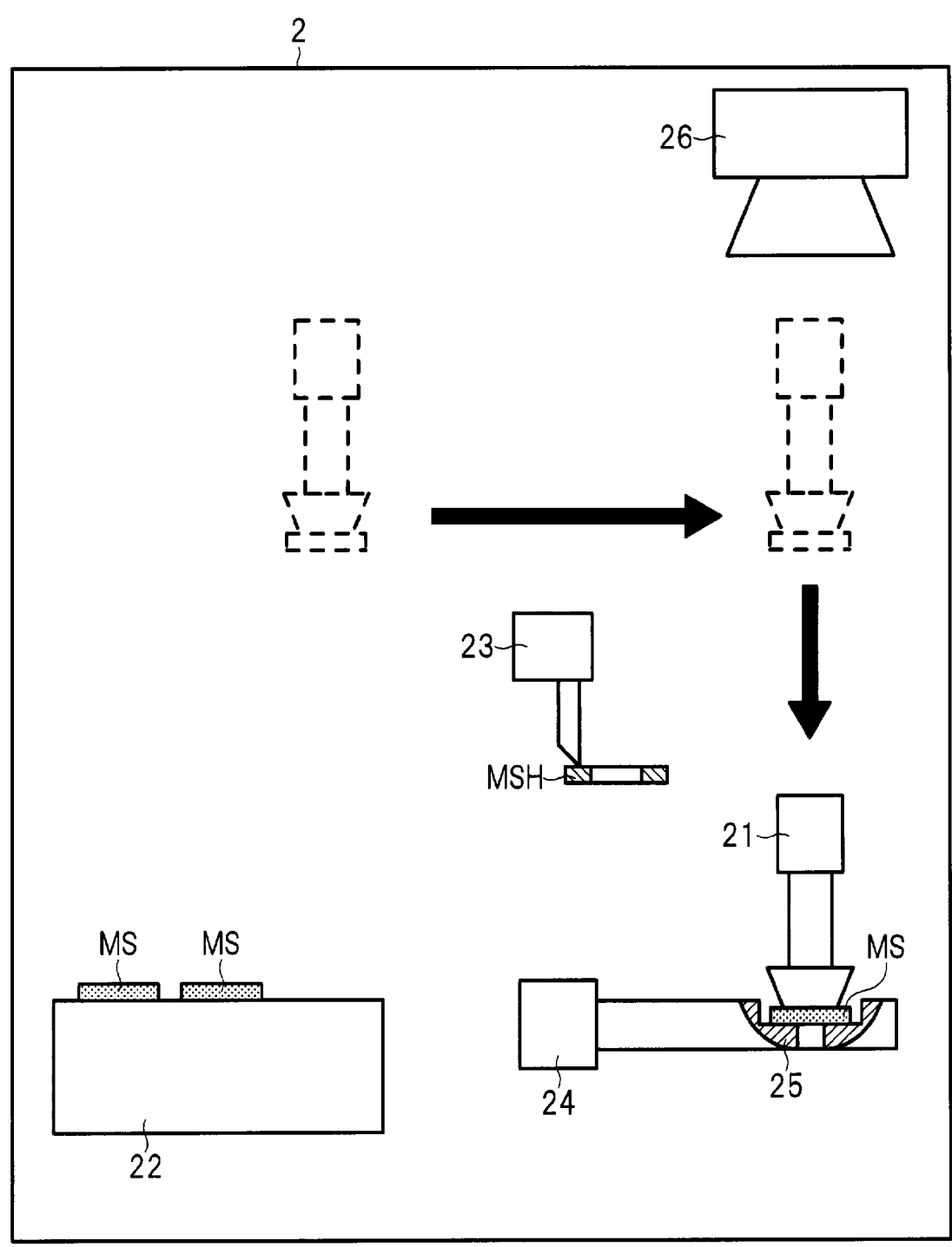

[FIG. 5]
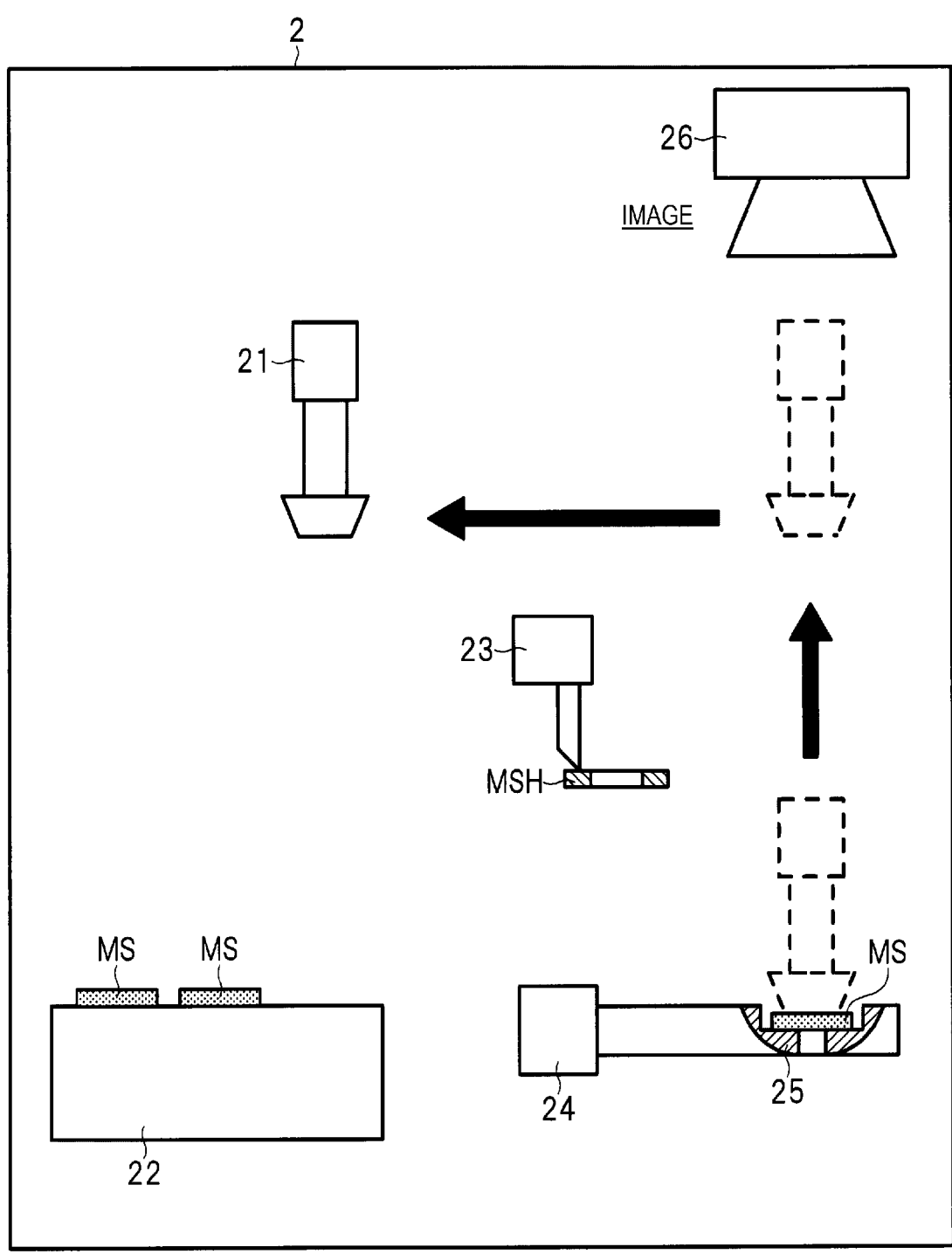

[FIG. 6]
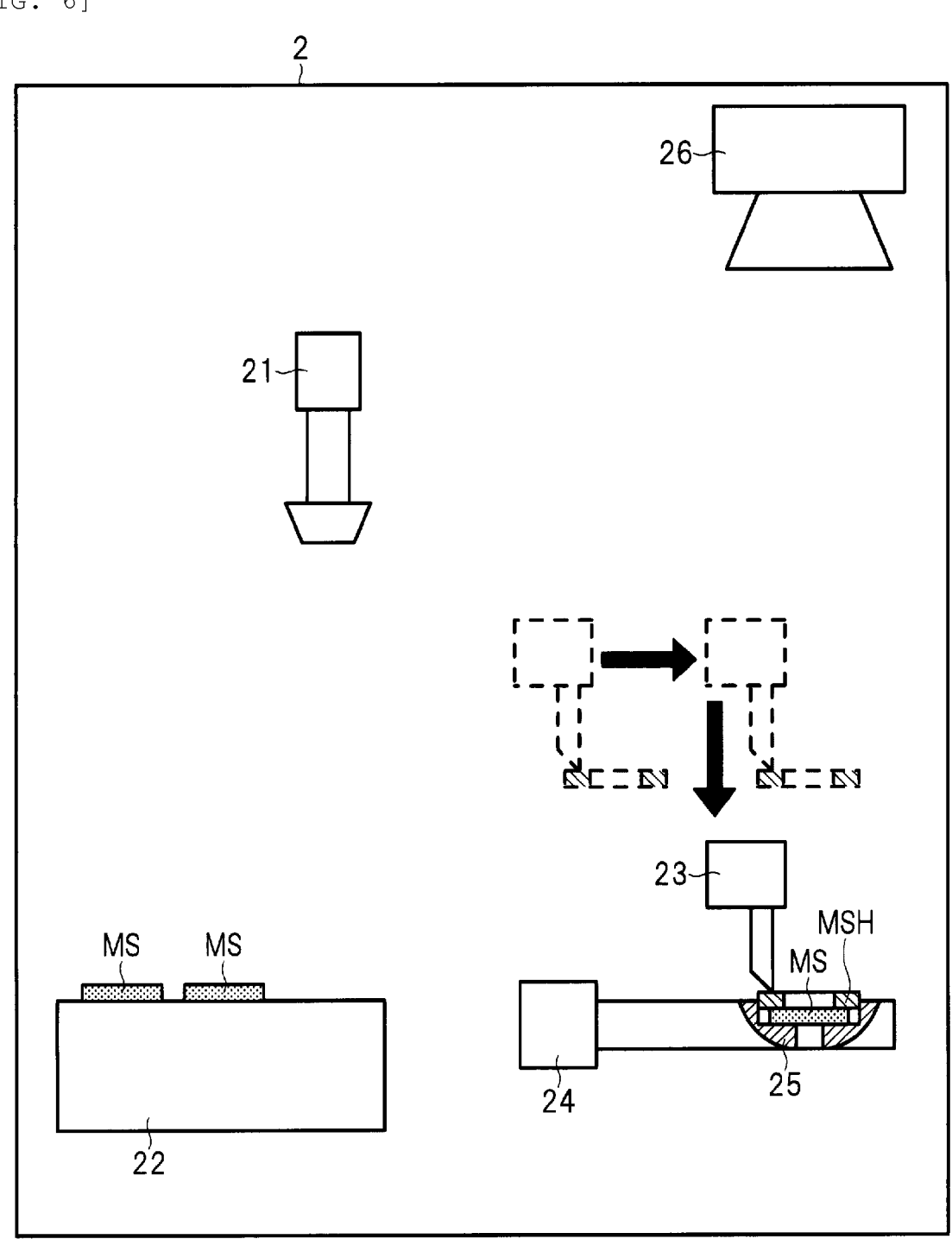

[FIG. 7]
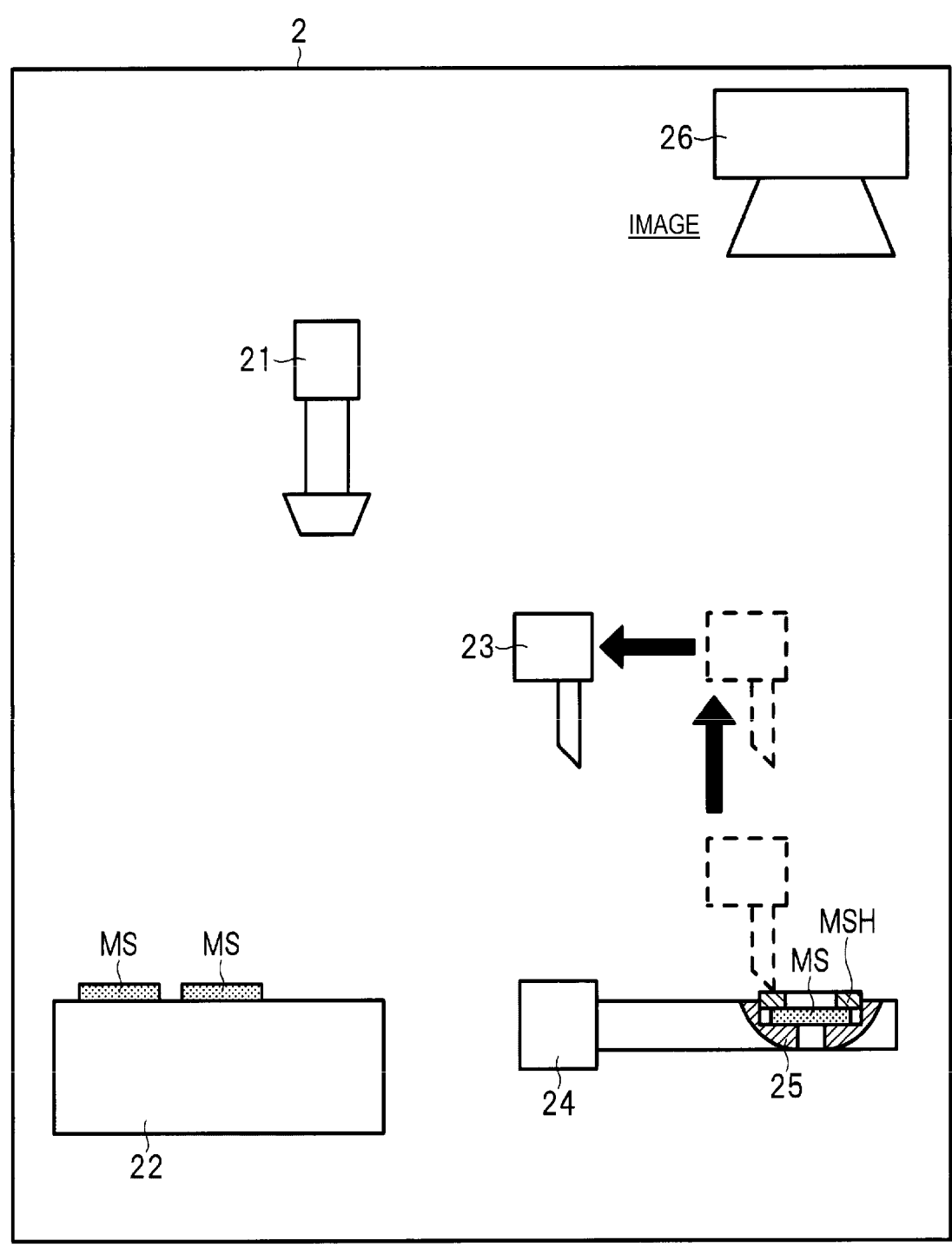

[FIG. 8]
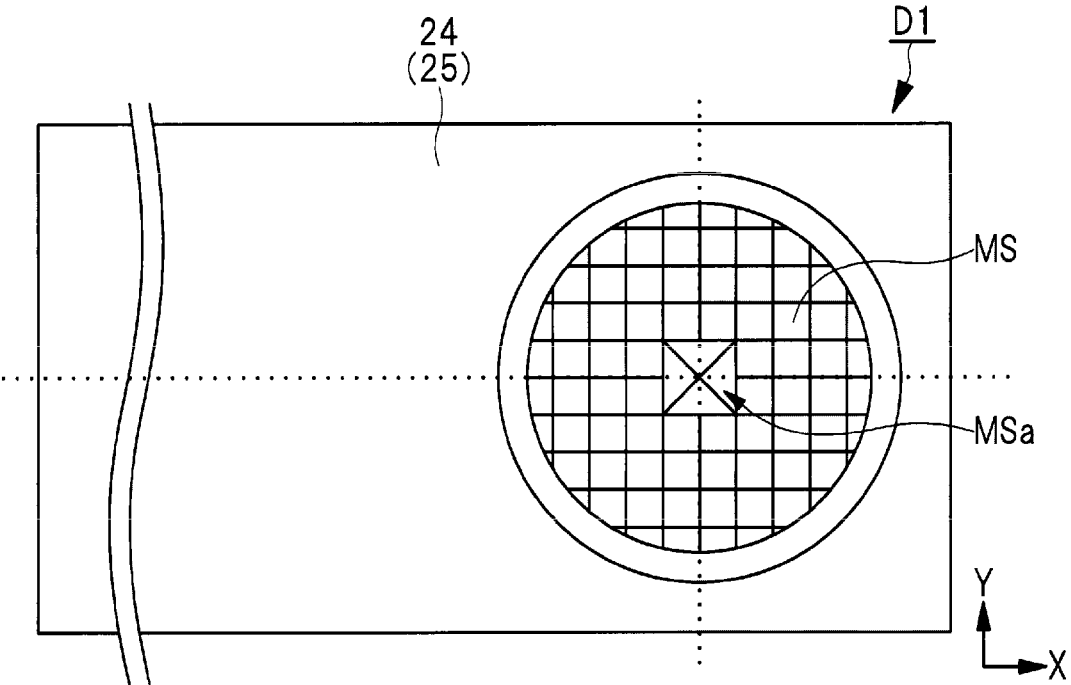
[FIG. 9]
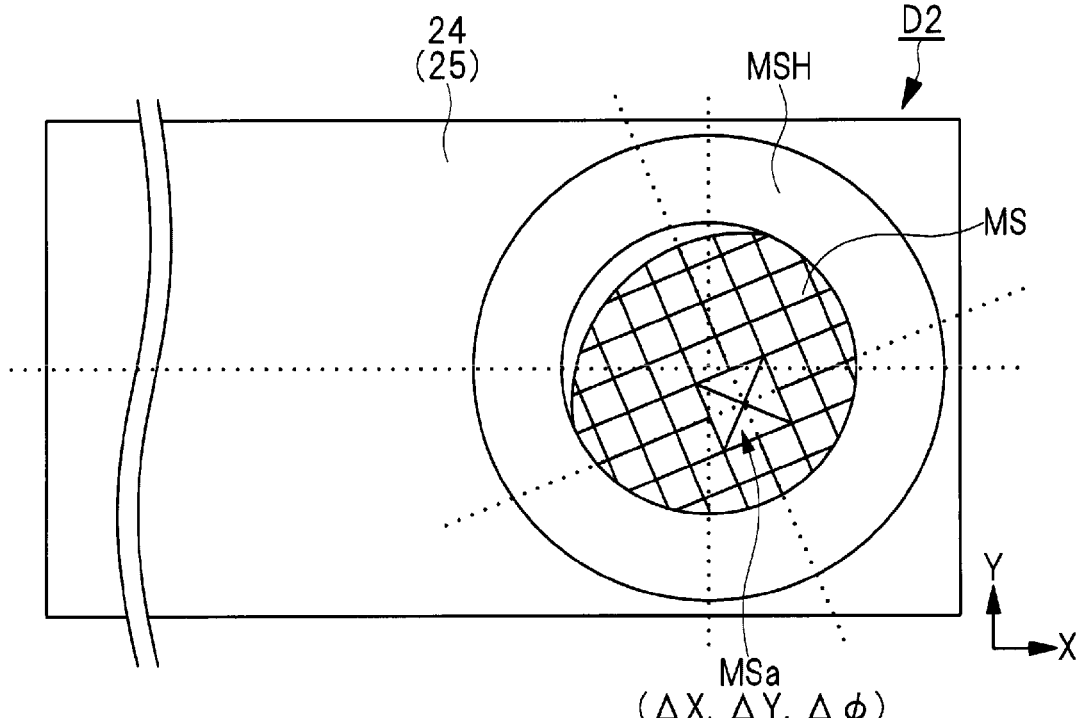

[FIG. 10]

| MESH ID | HOLDER No. | IMAGE DATA | |
|---|---|---|---|
| | | BEFORE FIXING | AFTER FIXING |
| 3 | 7 | ○○○.jpg | ×××.jpg |
| 8 | 15 | △△△.jpg | □□□.jpg |
| ⋮ | ⋮ | ⋮ | ⋮ |

[FIG. 11]

| MESH ID | HOLDER No. | SHIFT AMOUNT | | |
|---|---|---|---|---|
| | | $\Delta X$ | $\Delta Y$ | $\Delta \phi$ |
| 3 | 7 | 5 | 7 | 5 |
| 8 | 15 | 8 | 5 | 9 |
| ⋮ | ⋮ | ⋮ | ⋮ | ⋮ |

[FIG. 12]
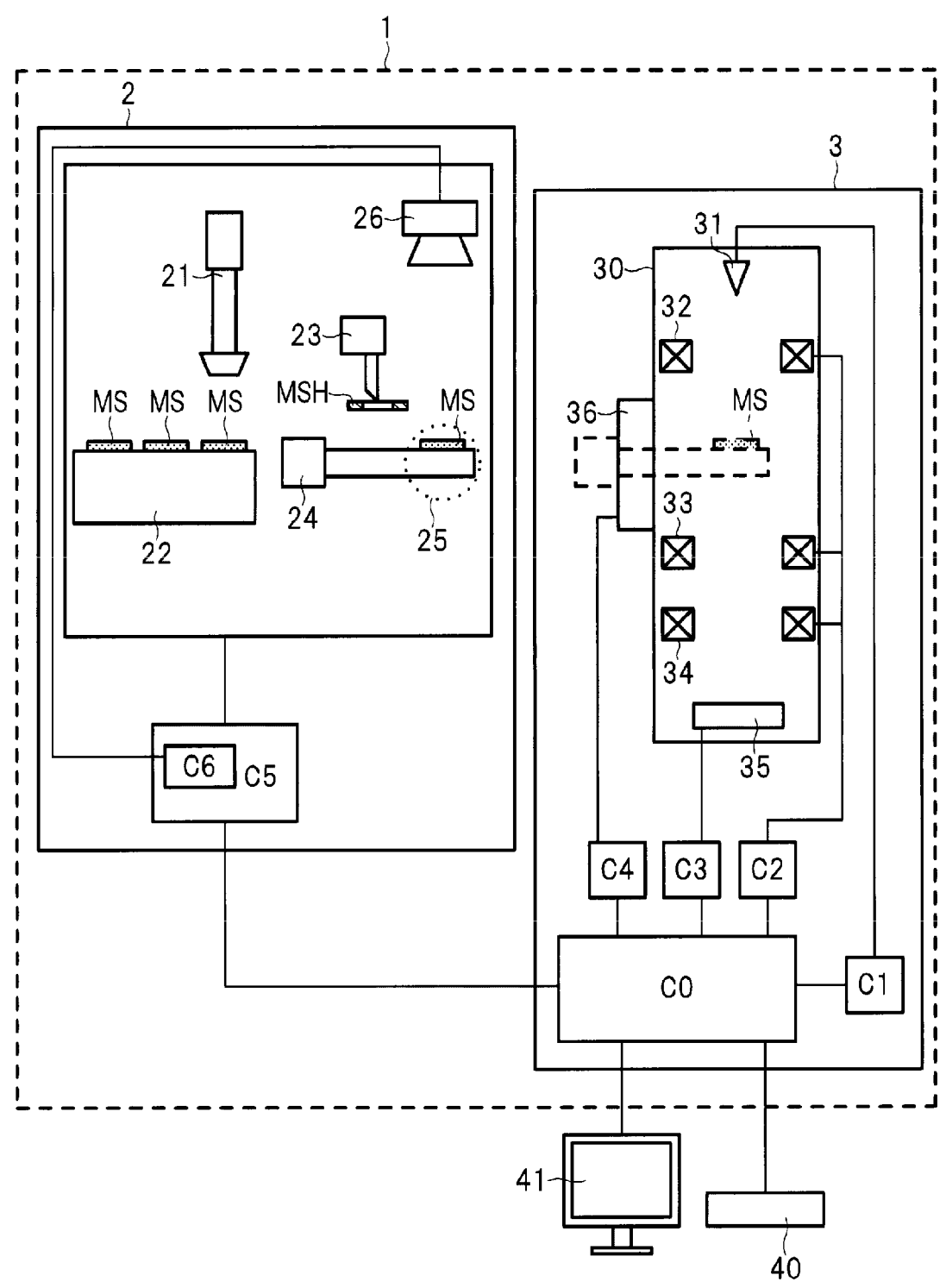

[FIG. 13]
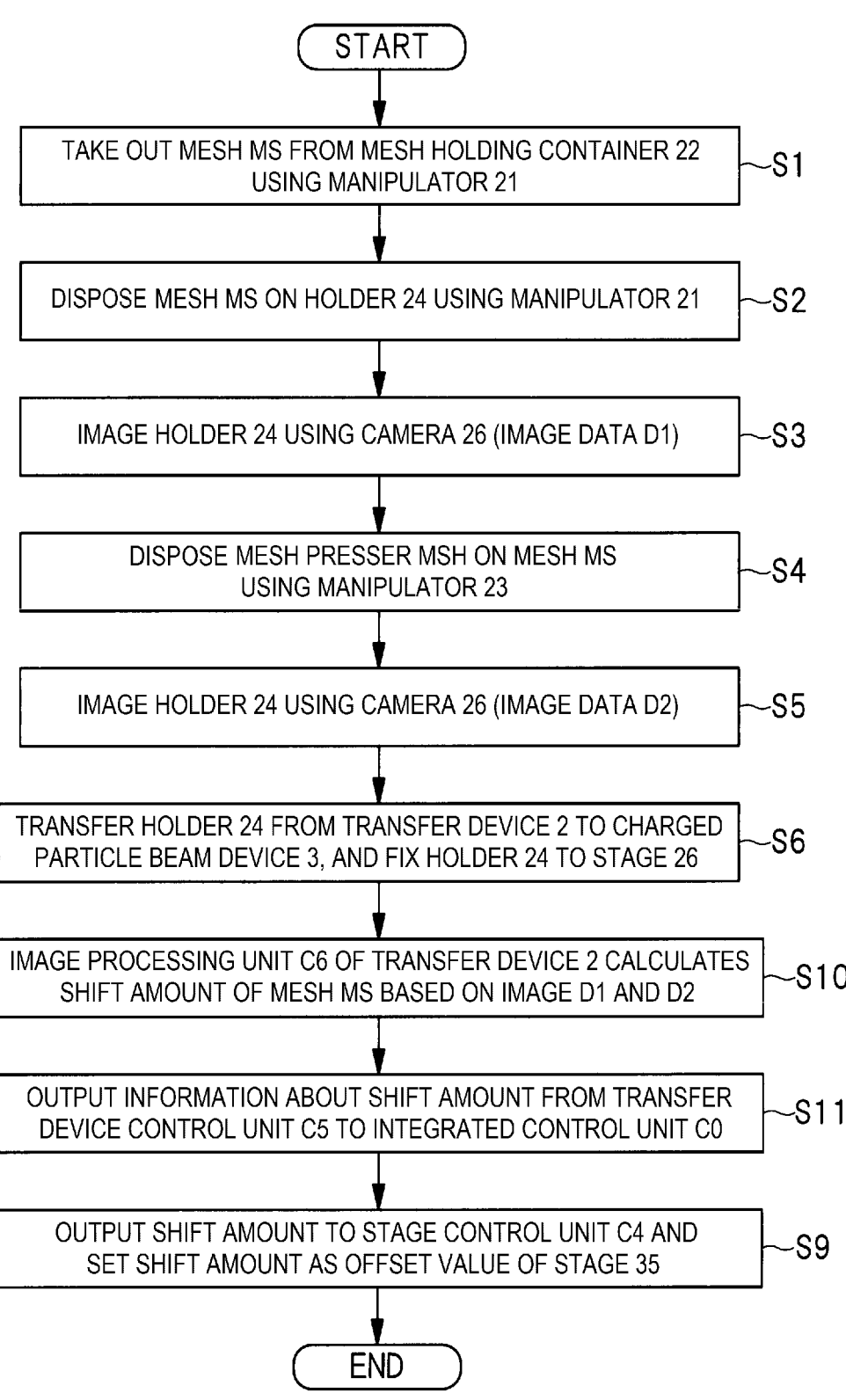

[FIG. 14]
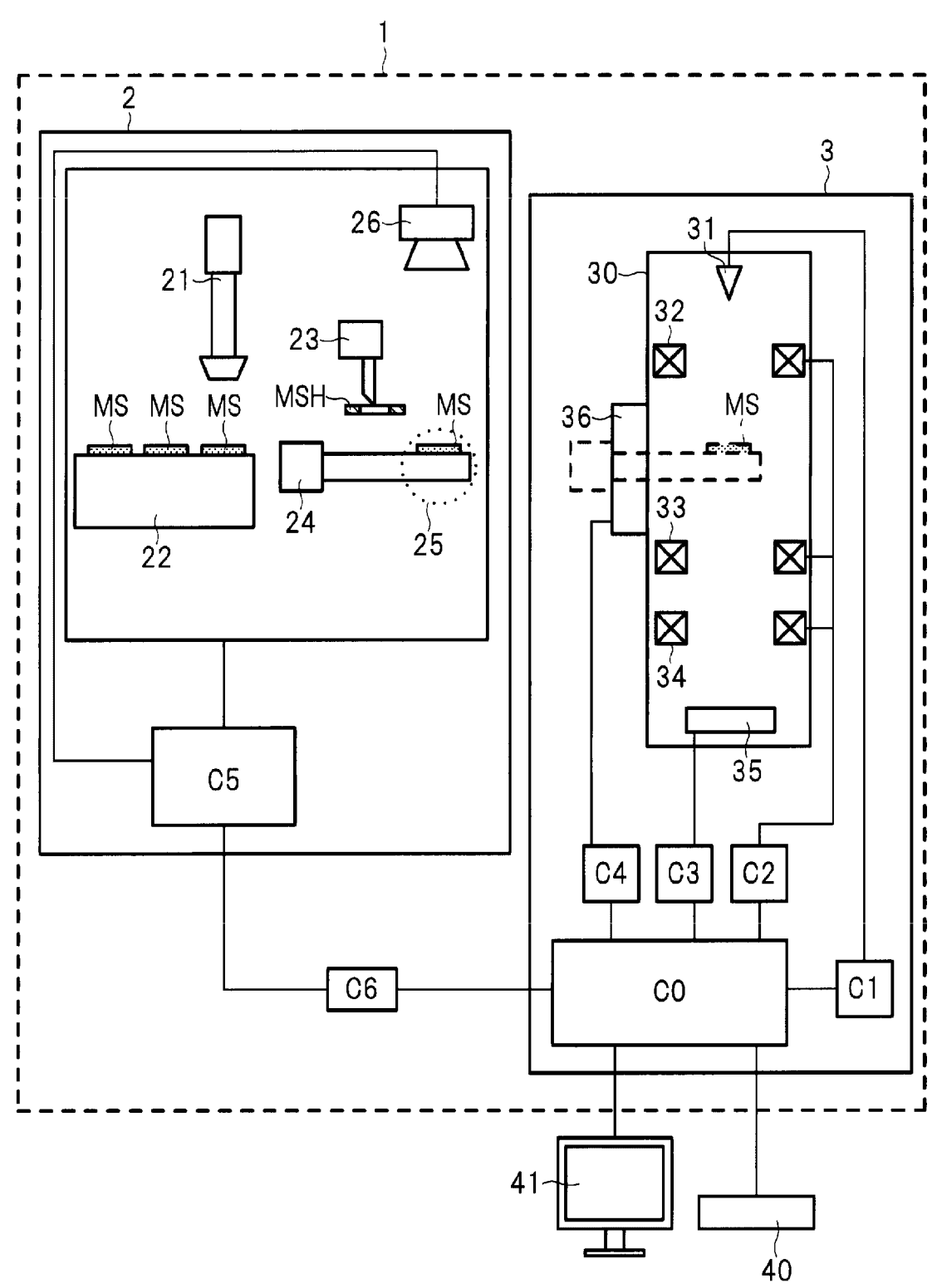

[FIG. 15]
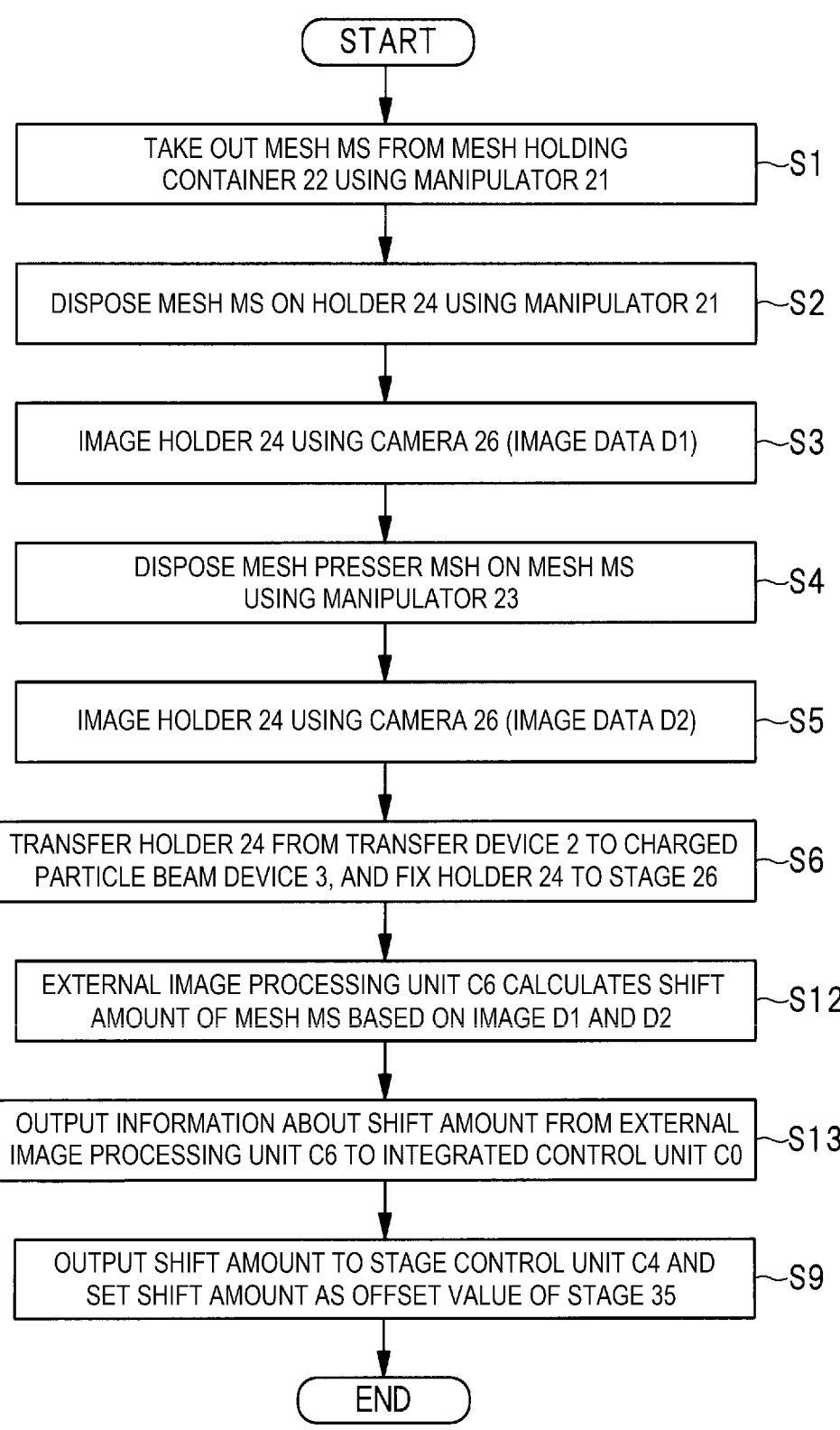

TRANSFER DEVICE AND ANALYSIS SYSTEM

TECHNICAL FIELD

The present invention relates to a transfer device and an analysis system, and in particular, the present invention can be suitably used for a transfer device and an analysis system including a holder that holds a mesh.

BACKGROUND ART

In recent years, miniaturization of a semiconductor tip device has been promoted. In order to observe a structure of a semiconductor tip device, for example, a technique is known in which a sample is taken out from a wafer by a focused ion beam (FIB) device, the sample that was taken out is mounted on a mesh, and the sample is observed using a transmission electron microscope (TEM).

Patent Literature 1 discloses a technique. In the technique, a mesh on which a sample is mounted is fixed to a cartridge, the cartridge is mounted on a holder, and the sample is observed using a TEM.

CITATION LIST

Patent Literature

PTL 1: JP-A-2008-27669

SUMMARY OF INVENTION

Technical Problem

A sample taken out from a wafer by an FIB device is mounted at a predetermined position of a mesh with reference to a reference area formed on the mesh. Therefore, after a holder to which the mesh is fixed is inserted into a sample chamber of a TEM, a step of searching for the reference area of the mesh is required. However, when observation is performed using the TEM, since a range of the field of view that can be checked is limited, a lot of time is required for the search. Therefore, the search step is a factor that makes it impossible to shorten observation throughput.

Even when the mesh can be mounted on the holder with high accuracy, the reference area of the mesh is shifted from the holder when the mesh is fixed by a mesh presser. Therefore, before a sample to be observed is observed using the TEM, the step of searching for the reference area of the mesh cannot be omitted.

Therefore, there is a demand for a technique capable of omitting the step of searching for the reference area of the mesh and shortening observation throughput of a sample, and there is a demand for development of a mesh transfer device and construction of an analysis system capable of implementing the technique.

Other problems and novel features will become apparent from the description of the present specification and the accompanying drawings.

Solution to Problem

An outline of a representative embodiment disclosed in the present application will be briefly described as follows.

A transfer device according to one embodiment includes: a holder configured to hold a mesh on which a sample to be analyzed using a charged particle beam device is mounted;

a position information acquisition function configured to acquire first information about a positional relationship between the mesh and the holder; and a position information output function configured to output the first information to the charged particle beam device.

An analysis system according to one embodiment includes: a transfer device configured to transfer a mesh on which a sample is mounted; and a charged particle beam device configured to analyze the sample. The transfer device includes: a holder configured to hold the mesh on which the sample is mounted; and a first control unit configured to acquire first information about a positional relationship between the mesh and the holder. The charged particle beam device includes: an electron gun configured to irradiate the sample with an electron beam; a stage used for fixing the holder; and a second control unit electrically connected to the first control unit and configured to control the electron gun and the stage. The analysis system has: (a) a step of placing the mesh on the holder; (b) a step of, after the step (a), placing a mesh presser on the mesh so as to press the mesh against the holder; (c) a step of, after the step (b), transferring the holder from the transfer device to the charged particle beam device and fixing the holder to the stage; (d) a step of, after the step (b), outputting the first information from the first control unit to the second control unit; (e) a step of, after the step (d), setting coordinates of the stage using the second control unit based on the first information; and (f) a step of, after the steps (c) to (e), irradiating the sample with the electron beam from the electron gun.

Advantageous Effects of Invention

According to an embodiment, observation throughput of a sample can be shortened.

BRIEF DESCRIPTION OF DRAWINGS

FIG. 1 is a schematic diagram showing an analysis system according to a first embodiment.

FIG. 2 is a flowchart showing a processing flow of the analysis system according to the first embodiment.

FIG. 3 is a schematic diagram showing an operation in a transfer device according to the first embodiment.

FIG. 4 is a schematic diagram showing the operation in the transfer device following FIG. 3.

FIG. 5 is a schematic diagram showing the operation in the transfer device following FIG. 4.

FIG. 6 is a schematic diagram showing the operation in the transfer device following FIG. 5.

FIG. 7 is a schematic diagram showing the operation in the transfer device following FIG. 6.

FIG. 8 is a schematic diagram showing image data according to the first embodiment.

FIG. 9 is a schematic diagram showing image data according to the first embodiment.

FIG. 10 is a recording table showing a recording example of image data according to the first embodiment.

FIG. 11 is a recording table showing a recording example of shift amounts according to the first embodiment.

FIG. 12 is a schematic diagram showing an analysis system according to a second embodiment.

FIG. 13 is a flowchart showing a processing flow of the analysis system according to the second embodiment.

FIG. 14 is a schematic diagram showing an analysis system according to a third embodiment.

FIG. 15 is a flowchart showing a processing flow of the analysis system according to the third embodiment.

DESCRIPTION OF EMBODIMENTS

Hereinafter, embodiments will be described in detail with reference to the drawings. In all of the drawings for showing the embodiments, members having the same function are denoted by the same reference signs, and the repeated description thereof is omitted. Further, in the following embodiments, the description of the same or similar parts will not be repeated in principle unless particularly necessary.

First Embodiment

<Configuration of Analysis System>

An analysis system 1 according to a first embodiment will be described below with reference to FIG. 1. As shown in FIG. 1, the analysis system 1 includes a transfer device 2 and a charged particle beam device 3 such as a transmission electron microscope (TEM).

The transfer device 2 mainly performs a step of fixing, to a holder 24, a mesh (a carrier) MS on which a sample (a lamellar and thin sample) is mounted and a step of transferring the holder 24 from the transfer device 2 to an inner side of the charged particle beam device 3. The charged particle beam device 3 fixes the holder 24 to a stage 36, and analyzes a structure of the sample by irradiating the sample with an electron beam.

Although not shown here, the analysis system 1 may include a sample preparation device including a focused ion beam (FIB), a scanning electron microscope (SEM), and the like. The sample preparation device processes a part of a wafer, and a sample is obtained from the wafer as a part of the wafer. Thereafter, the sample is mounted on the mesh MS, and the mesh MS is transferred from the sample preparation device to the transfer device 2.

The wafer includes a semiconductor substrate, a semiconductor element such as a transistor formed on the semiconductor substrate, and a wiring layer formed on the semiconductor element. Since the sample according to the first embodiment is a thin piece obtained from a part of the wafer, a structure of the sample includes all or a part of the semiconductor substrate, the semiconductor element, and the wiring layer.

The transfer device 2 includes a manipulator 21, a mesh holding container 22, a manipulator 23, the holder 24 that includes a mesh mounting portion 25, a camera 26, and a transfer device control unit C5.

A plurality of meshes MS are stored in the mesh holding container 22, and the sample is mounted on each of the plurality of meshes MS. The holder 24 is a member that holds the mesh MS. The manipulator 21 can hold the mesh MS by vacuum adsorption, and can place the mesh MS on the holder 24.

A method for holding the mesh MS is not limited to a method using the manipulator 21, and may be a method of holding the mesh MS by grasping the mesh MS using a tweezer.

The manipulator 23 can hold a mesh presser (a carrier presser) MSH, and can place the mesh presser MSH on the mesh MS after the mesh MS is disposed on the mesh mounting portion 25 of the holder 24. The mesh MS is fixed to the holder 24 by the mesh presser MSH.

The camera 26 can image a part or the entire of the holder 24. For example, the camera 26 can focus on a part of the holder 24 and image only the vicinity of the mesh mounting portion 25. A captured image of the holder 24 is recorded in the transfer device control unit C5 as image data.

The transfer device control unit C5 is electrically connected to the manipulator 21, the manipulator 23, the holder 24, and the camera 26, and can control operations of the manipulator 21, the manipulator 23, the holder 24, and the camera 26. The transfer device control unit C5 can acquire information about a positional relationship between the mesh MS and the holder 24, the information including the image data and the like, and the transfer device control unit C5 can store the information. The transfer device control unit C5 is electrically connected to an integrated control unit C0 of the charged particle beam device 3. Therefore, the above information can be output from the transfer device control unit C5 to the integrated control unit C0.

In other words, the transfer device 2 has a position information acquisition function for acquiring information about the positional relationship between the mesh MS and the holder 24, and a position information output function for outputting the information to the charged particle beam device 3.

The charged particle beam device 3 includes a mirror body 30 and control units C0 to C4. The mirror body 30 includes an electron gun 31, an irradiation lens 32, an objective lens 33, a projection lens 34, a detector 35, and the stage 36.

The electron gun 31 is an emission source of an electron beam. The electron beam emitted from the electron gun 31 is focused by the irradiation lens 32 and is emitted onto the sample mounted on the mesh MS. The transmitted electron beam transmitted through the sample is imaged by the objective lens 33, and the captured transmission image is enlarged by the projection lens 34. The detector 35 is, for example, a fluorescent plate, and the captured and enlarged transmission image is projected on the fluorescent plate and recorded as image data in the detector control unit C3 or the integrated control unit C0.

Each of the irradiation lens 32, the objective lens 33, and the projection lens 34 is a magnetic field type electron lens using a magnetic field generated by an excitation current flowing through a coil. A magnitude of the excitation current is controlled by the lens control unit C2.

The integrated control unit C0 is electrically or physically connected to the electron gun control unit C1, the lens control unit C2, the detector control unit C3, and the stage control unit C4, and controls the control units in an integrated manner. Therefore, in the present application, control executed by each of the control units C1 to C4 may be described as control executed by the integrated control unit C0. The integrated control unit C0 including the control units C1 to C4 may be regarded as one control unit, and the integrated control unit C0 may be simply referred to as a "control unit".

The electron gun control unit C1 is electrically connected to the electron gun 31 and controls an operation of the electron gun 31. The lens control unit C2 is connected to the irradiation lens 32, the objective lens 33, and the projection lens 34, and controls operations of these lenses. The detector control unit C3 is electrically connected to the detector 35 and controls an operation of the detector 35. The stage control unit C4 is electrically connected to the stage 36 and controls an operation of the stage 36.

The stage 36 includes an XY axis drive mechanism that can be driven in a direction parallel to a mounting surface of the charged particle beam device 3, a Z axis drive mechanism that can be driven in a direction (a height direction)

perpendicular to the mounting surface, an R axis drive mechanism that can be driven in a rotation direction, and a T axis drive mechanism that can be driven in a direction inclined relative to an XY plane. These drive mechanisms are used to analyze any portion of the holder 24 fixed on the stage 36. The stage control unit C4 or the integrated control unit C0 controls these drive mechanisms, so that the stage 36 can be moved to set coordinates of the stage 36.

The integrated control unit C0 according to the first embodiment includes an image processing unit C6. The image processing unit C6 executes calculation processing on image data acquired using the camera 26 or the like, so that it is possible to calculate a shift amount indicating how much the mesh MS is shifted as information about a positional relationship between the mesh MS and the holder 24. The shift amount is output from the image processing unit C6 to the stage control unit C4, so that it is possible to set coordinates of the stage 36 reflecting the shift amount.

The charged particle beam device 3 includes an input device 40 and a display 41 outside or inside the charged particle beam device 3, and the input device 40 and the display 41 are electrically connected to the integrated control unit C0. The input device 40 is, for example, a mouse or a rack ball. When a user works on the display 41 using the input device 40, various kinds of information are input to the integrated control unit C0 or output from the integrated control unit C0.

<Processing Flow of Analysis System>

Hereinafter, the analysis system 1 according to the first embodiment will be described while comparing steps S1 to S9 shown in a flowchart in FIG. 2 with FIGS. 3 to 11. In addition, various functions such as the position information acquisition function and the position information output function that are provided in the transfer device 2 will also be described.

<<Position Information Acquisition Function>>

First, the position information acquisition function of the transfer device 2 will be described. Immediately before step S1 in FIG. 2, a sample is prepared, the prepared sample is mounted on the mesh MS, and the mesh MS is stored in the mesh holding container 22. That is, a plurality of meshes MS on which samples are mounted are prepared in the mesh holding container 22.

In step S1, a mesh MS is taken out from the mesh holding container 22. As shown in FIG. 3, among the plurality of meshes MS mounted in the mesh holding container 22, a desired mesh MS is taken out using the manipulator 21.

Next, in step S2, the mesh MS is disposed on the holder 24. As shown in FIG. 4, the manipulator 21 holding the mesh MS is moved above the holder 24, and then the manipulator 21 is lowered, thereby placing the mesh MS on the mesh mounting portion 25 of the holder 24.

Next, in step S3, the holder 24 is imaged. As shown in FIG. 5, the manipulator 21 is moved from the holder 24 to the outside of an imaging field of the camera 26. Next, the camera 26 is used to image the holder 24 (the mesh mounting portion 25). A captured image is recorded in the transfer device control unit C5 as image data D1. The image data D1 is regarded as a part of information about a positional relationship between the mesh MS and the holder 24 in a state in which the mesh MS is disposed on the holder 24.

FIG. 8 shows an example of the image data D1. Here, a state is shown in which the mesh MS is mounted on the holder 24 with high accuracy. A reference area MSa is formed on a part of the mesh MS. The reference area MSa has a shape different from a shape of surrounding grids, and can be used as a mark in a case of calculating a shift amount to be described later.

Next, in step S4, a mesh presser MSH is disposed on the mesh MS. As shown in FIG. 6, the manipulator 23 holding the mesh presser MSH is moved above the holder 24, and then the manipulator 23 is lowered, thereby placing the mesh presser MSH on the mesh MS such that the mesh MS is pressed against the holder 24. Accordingly, the mesh MS is fixed to the holder 24.

Here, even when the mesh MS is mounted on the holder 24 with high accuracy, a position of the mesh MS may be shifted by the mesh presser MSH, and a position of the reference area MSa may be shifted.

Next, in step S5, the holder 24 is imaged. As shown in FIG. 7, the manipulator 23 is moved from the holder 24 to the outside of an imaging field of the camera 26. Next, the camera 26 is used to image the holder 24 (the mesh mounting portion 25). A captured image is recorded in the transfer device control unit C5 as image data D2. The image data D2 is regarded as a part of information about a positional relationship between the mesh MS and the holder 24 in a state in which the mesh MS is fixed to the holder 24 by the mesh presser MSH.

FIG. 9 shows an example of the image data D2. Here, a state is shown in which a position of the mesh MS is shifted by the mesh presser MSH.

FIG. 10 is a recording table in which the image data D1 (before fixing) acquired in step S3 and the image data D2 (after fixing) acquired in step S5 are recorded. Identification information (ID) of each mesh MS and a number (NO) of each holder 24 are associated with the image data D1 and the image data D2. Such a recording table is stored in the transfer device control unit C5. Accordingly, it is possible to manage that the predetermined mesh MS and the holder 24 correspond to which image data D1 and image data D2.

Next, in step S6, the holder 24 is transferred. A sample is mounted on the mesh MS, and the mesh MS is fixed to the holder 24. In this state, the holder 24 is transferred from transfer device 2 to the charged particle beam device 3, and the holder 24 is fixed to the stage 36.

<<Position Information Output Function>>

Hereinafter, the position information output function of the transfer device 2 will be described.

In step S7, the image data D1 and the image data D2 are output from the transfer device 2 to the charged particle beam device 3. The image data D1 and the image data D2 that are recorded in the transfer device control unit C5 are output to the image processing unit C6 of the integrated control unit C0 as a part of the information about the positional relationship between the mesh MS and the holder 24.

<<Shift Amount Calculation Function>>

In step S8, a shift amount of the mesh MS is calculated. In the first embodiment, since the image processing unit C6 is provided in the integrated control unit C0 of the charged particle beam device 3, the shift amount calculation function is provided in the charged particle beam device 3.

The image processing unit C6 of the integrated control unit C0 can compare the image data D1 and the image data D2 and calculate a shift amount indicating how much a position of the mesh MS in the image data D2 is shifted from a position of the mesh MS in the image data D1.

An example of a method for calculating the shift amount includes a method using the reference area MSa of the mesh MS. For example, with reference to FIGS. 8 and 9, how much a position of the reference area MSa in the image data D2 is shifted from a position of the reference area MSa in the image data D1 is calculated. That is, movement amounts (ΔX, ΔY) in the X direction and the Y direction in a plan view and a rotation angle (ΔΦ) in a plan view are measured. Values of ΔX, ΔY and ΔΦ are calculated as the shift amount.

The reference area MSa in the first embodiment is an area having a shape different from a shape of grids around the reference area MSa, and is formed near the center of the mesh MS. Alternatively, the reference area MSa may be any area as long as it can be identified that the reference area MSa corresponds to coordinates of which position of the mesh MS. For example, a specific mark formed on an outer periphery of the mesh MS, such as an area surrounding grids, may be used as the reference area MSa. Instead of only one reference area MSa, a plurality of reference areas MSa may be formed on the mesh MS. The shift amount can be calculated with high accuracy using a plurality of reference areas MSa.

FIG. 11 is a recording table in which the shift amount acquired in step S8 is recorded. Similar to the image data D1 and the image data D2, identification information (ID) of each mesh MS and a number (NO) of each holder 24 are associated with information about the shift amount. Such a recording table is stored in the image processing unit C6 or the integrated control unit C0. According to the recording tables in FIGS. 10 and 11, it is possible to manage that the predetermined mesh MS and the holder 24 correspond to which shift amount, image data D1, and image data D2.

Another example of the method for calculating the shift amount includes a method using a screen matching technique. In this case, the image processing unit C6 has the screen matching technique. In the screen matching technique, a shape of the mesh MS in the image data D2 and a shape of the mesh MS in the image data D1 are compared with each other, and a difference between the shapes is calculated as position data, thereby obtaining a shift amount.

In step S9, the charged particle beam device 3 sets the shift amount as an offset value of the stage 36. The shift amount obtained in step S8 is output to the stage control unit C4, and the stage control unit C4 sets coordinates of the stage 36 based on the shift amount. As described above, the integrated control unit C0 controls the control units including the stage control unit C4. Therefore, it can be said that the integrated control unit C0 sets the coordinates of the stage 36 based on the shift amount. Thereafter, a sample is observed by irradiating the sample with an electron beam from the electron gun 31.

As described above, a step of searching for the reference area MSa of the mesh MS is required before observing the sample to be observed using the charged particle beam device 3. Even when the mesh MS can be mounted on the holder 24 with high accuracy, since a position of the mesh MS is shifted when the mesh presser MSH is disposed on the mesh MS, the step of searching for the reference area MSa cannot be omitted.

On the other hand, the coordinates of the stage 36 are set based on the shift amount when a sample is observed in the first embodiment. Therefore, the step of searching for the reference area MSa can be omitted, and a desired sample can be quickly placed in an imaging field of view. That is, observation throughput of the sample can be shortened.

The mesh MS is mounted on the holder 24 with high accuracy in step S2, and when the mounting accuracy of the mesh MS is low, there is no big problem if the technique according to the first embodiment is used. That is, since the shift is calculated in step S8 based on the image data D1 acquired in step S2 and the image data D2 acquired in step S4, the stage 36 can be controlled such that a desired sample enters a correct imaging field of view regardless of the mounting accuracy of the mesh MS.

Although step S6 is performed before steps S7 to S9 in the first embodiment, step S6 may be performed after step S7, after step S8, or after step S9. As described above, the identification information (ID) of each mesh MS and the number (NO) of each holder 24 are associated with the information about the shift amount, the image data D1, and the image data D2. Therefore, there is no problem even when a timing at which the holder 24 is fixed to the stage 36 is before or after processing of information such as the shift amount, the image data D1, and the image data D2. That is, it is sufficient that the coordinates of the stage 36 reflect the shift amount before the sample is irradiated with the electron beam.

<<Analysis Function>>

The charged particle beam device 3 has an analysis function for analyzing a sample. After step S9, a sample is observed by the analysis function of the charged particle beam device 3.

An electron beam emitted from the electron gun 31 is focused by the irradiation lens 32 and is emitted onto a sample mounted on the mesh MS. The transmitted electron beam transmitted through the sample is imaged by the objective lens 33, and the captured transmission image is enlarged by the projection lens 34.

When the detector 35 is a fluorescent plate, the captured and enlarged transmission image is projected on the fluorescent plate and recorded as image data in the detector control unit C3 or the integrated control unit C0. The acquired image data is displayed on the display 41, and a user can check a detailed structure of the sample.

Modification

Hereinafter, a modification of the first embodiment will be described.

In step S3 in the first embodiment, the positional relationship between the mesh MS and the holder 24 is imaged using the camera 26, and the captured image is recorded as the image data D1. In the modification, the imaging in step S3 is omitted, and an image captured in advance inside or outside the transfer device 2 is used as the image data D1.

Similar to the first embodiment, the image data D1 in the modification is also image data indicating a state in which the mesh MS is disposed on the holder 24.

For example, as shown in FIG. 1, a plurality of meshes MS are stored in the mesh holding container 22. Samples having the same shape are mounted on these meshes MS. Therefore, the image data D1 obtained by imaging a first mesh MS can be applied as the image data D1 of second and subsequent meshes MS. Therefore, imaging of the second and subsequent meshes MS can be omitted, so that observation throughput can be further shortened.

The meshes MS on which the samples having the same shape are mounted may not be imaged by the transfer device 2, and may be imaged in advance by another device outside the transfer device 2. Such an image can also be applied as the image data D1.

Second Embodiment

The analysis system 1 according to a second embodiment will be described below with reference to FIGS. 12 and 13. Hereinafter, differences from the first embodiment will be mainly described.

In the first embodiment, the image processing unit C6 is provided in the integrated control unit C0 of the charged particle beam device 3. In the second embodiment, the image processing unit C6 is provided in the transfer device control unit C5 of the transfer device 2. Therefore, the shift amount calculation function is provided in the transfer device 2.

In the second embodiment, step S10 and step S11 are performed instead of step S7 and step S8 in the first embodiment.

In step S10, the shift amount of the mesh MS is calculated. The image processing unit C6 of the transfer device 2 compares the image data D1 and the image data D2 and calculates a shift amount indicating how much a position of the mesh MS in the image data D2 is shifted from a position of the mesh MS in the image data D1. Similar to the first embodiment, a method for calculating the shift amount may be a method for calculating the shift amount based on a position shift of the reference area MSa or a method using an image matching technique.

In step S11, the shift amount, the image data D1, and the image data D2 are output from the transfer device control unit C5 of the transfer device 2 to the integrated control unit C0 of the charged particle beam device 3 as a part of the information about the positional relationship between the mesh MS and the holder 24. Thereafter, in step S9, the acquired shift amount is output to the stage control unit C4, and the stage control unit C4 sets coordinates of the stage 36 based on the shift amount.

As described above, the step of searching for the reference area MSa can also be omitted when a sample is observed, and observation throughput of the sample can also be shortened in the second embodiment.

Third Embodiment

The analysis system 1 according to a third embodiment will be described below with reference to FIGS. 14 and 15. Hereinafter, differences from the first and second embodiments will be mainly described.

In the third embodiment, the image processing unit C6 is provided as an external device outside the transfer device 2 and outside the charged particle beam device 3. The image processing unit C6 is electrically connected to the transfer device control unit C5 and the integrated control unit C0, and can communicate with the transfer device control unit C5 and the integrated control unit C0. The image processing unit C6 also constitutes a part of the analysis system 1.

In the third embodiment, step S12 and step S13 are performed instead of step S7 and step S8 in the first embodiment (step S10 and step S11 in the second embodiment).

In step S12, the image processing unit C6 which is an external device calculates the shift amount of the mesh MS. Similar to the first embodiment and the second embodiment, a method for calculating the shift amount may be a method for calculating the shift amount based on a position shift of the reference area MSa or a method using an image matching technique.

In step S13, the shift amount, the image data D1, and the image data D2 are output from the image processing unit C6 to the integrated control unit C0 of the charged particle beam device 3 as a part of the information about the positional relationship between the mesh MS and the holder 24. Thereafter, in step S9, the acquired shift amount is output to the stage control unit C4, and the stage control unit C4 sets coordinates of the stage 36 based on the shift amount.

As described above, the step of searching for the reference area MSa can also be omitted when a sample is observed, and observation throughput of the sample can also be shortened in the third embodiment.

Although the invention has been described in detail based on the above embodiments, the invention is not limited to the above embodiments, and various modifications can be made without departing from the gist of the invention.

For example, although the sample in the above embodiments has been mainly described as a semiconductor device such as a semiconductor substrate, a semiconductor element, and a wiring layer, the sample may be a device in a field other than the semiconductor device.

In addition, a part or all steps such as steps S1 to S13 may be performed by a user, or may be performed by artificial intelligence provided in the transfer device control unit C5 and/or the integrated control unit C0.

REFERENCE SIGNS LIST 1 analysis system
2 transfer device
3 charged particle beam device
21 manipulator
22 mesh holding container
23 manipulator
24 holder
25 mesh mounting portion
26 camera
30 mirror body
31 electron gun
32 irradiation lens
33 objective lens
34 projection lens
35 detector
36 stage
40 input device
41 display
C0 integrated control unit
C1 electron gun control unit
C2 lens control unit
C3 detector control unit
C4 stage control unit
C5 transfer device control unit
C6 image processing unit
D1, D2 image data
MS mesh
MSH mesh presser
S1 to S13 steps

The invention claimed is:
1. A transfer device comprising:
a holder configured to hold a mesh on which a sample is mounted;
a manipulator configured to fix the mesh to the holder via a mesh presser; and
an integrated control unit configured to acquire first information about a positional shift of a reference area of the mesh relative to the holder due to fixing the mesh to the holder and output the first information to a charged particle beam device that is configured to analyze the sample.
2. The transfer device according to claim 1, wherein the first information includes second information and third information,

the second information is information about a positional relationship between the reference area and the holder in a state in which the mesh is disposed on the holder, and the third information is information about a positional relationship between the reference area and the holder in a state in which the mesh is fixed to the holder by the mesh presser.

3. The transfer device according to claim 2, wherein the second information includes first image data obtained by imaging a state in which the mesh is disposed on the holder, and the third information includes second image data obtained by imaging a state in which the mesh is fixed to the holder by the mesh presser.

4. The transfer device according to claim 3, further comprising:

a camera configured to image the holder, wherein the first image data and the second image data are image data obtained by the camera.

5. The transfer device according to claim 3, further comprising:

a camera configured to image the holder, wherein the second image data is image data obtained by the camera, and the first image data is image data obtained in advance inside or outside the transfer device.

6. The transfer device according to claim 3, wherein the integrated control unit is configured to calculate a shift amount indicating how much a position of the mesh in the second image data is shifted from a position of the mesh in the first image data, and the first information also includes the shift amount.

7. The transfer device according to claim 6, wherein the reference area is formed on a part of the mesh, and the shift amount is calculated by measuring how much a position of the reference area in the second image data is shifted from a position of the reference area in the first image data.

8. The transfer device according to claim 6, wherein the integrated control unit has a screen matching technique, and the shift amount is calculated by comparing a shape of the mesh in the second image data and a shape of the mesh in the first image data using the screen matching technique.

9. The transfer device according to claim 1, wherein the first information is based on second information and third information, the second information is information about a positional relationship between the reference area and the holder in a state in which the mesh is disposed on the holder, and the third information is information about a positional relationship between the reference area and the holder in a state in which the mesh is fixed to the holder by the mesh presser.

10. An analysis system comprising:

a transfer device configured to transfer a mesh that has a reference area and on which a sample is mounted; and a charged particle beam device configured to analyze the sample, wherein the transfer device includes a holder configured to hold the mesh;

a manipulator configured to fix the mesh to the holder via a mesh presser, and

an integrated control unit configured to acquire first information about a positional shift of the reference area relative to the holder due to fixing the mesh to the holder, the charged particle beam device includes an electron gun configured to irradiate the sample with an electron beam, a stage used for fixing the holder, and a stage control unit electrically connected to the integrated control unit and configured to control the stage, the transfer device is configured to transfer the holder to the charged particle beam device;

the integrated control unit is configured to output the first information to the stage control unit;

the stage control unit is configured to set coordinates of the stage based on the first information; and the electron gun is configured to irradiate the sample with the electron beam.

11. The analysis system according to claim 10, wherein the integrated control unit acquires second information about a positional relationship between the mesh and the holder in a state in which the mesh is disposed on the holder, the integrated control unit acquires third information about a positional relationship between the mesh and the holder in a state in which the mesh is fixed to the holder by the mesh presser, and the first information includes the second information and the third information.

12. The analysis system according to claim 11, wherein the transfer device further includes a camera configured to image the holder, the second information includes first image data obtained by imaging a state in which the mesh is disposed on the holder, the third information includes second image data obtained by imaging a state in which the mesh is fixed to the holder by the mesh presser, the second image data is image data obtained by the camera, and the first image data is image data obtained by the camera or image data obtained in advance inside or outside the transfer device.

13. The analysis system according to claim 12, wherein the integrated control unit is configured to compare the first image data with the second image data and calculate a shift amount indicating how much a position of the mesh in the second image data is shifted from a position of the mesh in the first image data, wherein the first information also includes the shift amount.

14. The analysis system according to claim 13, wherein the integrated control unit is provided outside the transfer device and outside the charged particle beam device.

15. The analysis system according to claim 10, wherein the integrated control unit acquires second information about a positional relationship between the reference area and the holder in a state in which the mesh is provided on the holder, the integrated control unit acquires third information about a positional relationship between the reference area and the holder in a state in which the mesh is fixed to the holder by the mesh presser, and the first information is based on the second information and the third information.

* * * * *